United States Patent
Anwar et al.

(10) Patent No.: US 12,312,689 B2
(45) Date of Patent: May 27, 2025

(54) LARGE-AREA HIGH-DENSITY PLASMA PROCESSING CHAMBER FOR FLAT PANEL DISPLAYS

(71) Applicant: Applied Materials, Inc., Santa Clara, CA (US)

(72) Inventors: Suhail Anwar, Saratoga, CA (US); Yui Lun Wu, Castro Valley, CA (US); Jozef Kudela, Morgan Hill, CA (US); Carl A. Sorensen, Morgan Hill, CA (US); Jeevan Prakash Sequeira, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 313 days.

(21) Appl. No.: 16/400,923

(22) Filed: May 1, 2019

(65) Prior Publication Data
US 2020/0347499 A1    Nov. 5, 2020

(51) Int. Cl.
    *C23C 16/455*  (2006.01)
    *C23C 16/505*  (2006.01)
    *H01J 37/32*   (2006.01)

(52) U.S. Cl.
    CPC ...... *C23C 16/45559* (2013.01); *C23C 16/505* (2013.01); *H01J 37/3211* (2013.01); *H01J 37/32183* (2013.01); *H01J 37/32449* (2013.01); *H01J 2237/3321* (2013.01); *H01J 2237/3323* (2013.01); *H01J 2237/3325* (2013.01)

(58) Field of Classification Search
    USPC .............. 156/345.48; 118/723 I, 723 AN
    See application file for complete search history.

(56) References Cited

U.S. PATENT DOCUMENTS

| | | | |
|---|---|---|---|
| 8,247,977 B2 * | 8/2012 | Vinogradov | H05H 1/46 315/111.51 |
| 2001/0047760 A1 * | 12/2001 | Moslehi | H01J 37/321 118/723 I |
| 2007/0163996 A1 | 7/2007 | Horiguchi | |
| 2008/0206987 A1 * | 8/2008 | Gelatos | C23C 16/34 438/654 |
| 2008/0236490 A1 * | 10/2008 | Paterson | H01J 37/321 118/723 I |
| 2011/0036499 A1 * | 2/2011 | Lee | C23C 16/50 156/345.48 |

(Continued)

OTHER PUBLICATIONS

International Search Report and Written Opinion issued in PCT/US2020/030301 dated Aug. 18, 2020.

*Primary Examiner* — Ram N Kackar
(74) *Attorney, Agent, or Firm* — Patterson + Sheridan, LLP

(57) ABSTRACT

Embodiments described herein provide a lid assembly of a chamber for independent control of plasma density and gas distribution within the interior volume of the chamber. The lid assembly includes a plasma generation system and a gas distribution assembly. The plasma generation system includes a plurality of dielectric plates having a bottom surface oriented with respect to vacuum pressure and a top surface operable to be oriented with respect to atmospheric pressure. One or more coils are positioned on or over the plurality of dielectric plates. The gas distribution assembly includes a first diffuser and a second diffuser. The first diffuser includes a plurality of first channels intersecting a plurality of second channels of the second diffuser.

18 Claims, 5 Drawing Sheets

(56) References Cited

U.S. PATENT DOCUMENTS

| | | |
|---|---|---|
| 2013/0192769 A1 | 8/2013 | Setsuhara et al. |
| 2014/0339981 A1 | 11/2014 | Komatsu et al. |
| 2015/0044878 A1 | 2/2015 | Holland et al. |
| 2016/0118229 A1* | 4/2016 | Iwai ............... H01J 37/321 |
| | | 156/345.48 |
| 2019/0122866 A1 | 4/2019 | Nam et al. |
| 2019/0148119 A1* | 5/2019 | Sung ............ H01L 21/68735 |
| | | 156/345.48 |

* cited by examiner

LARGE-AREA HIGH-DENSITY PLASMA PROCESSING CHAMBER FOR FLAT PANEL DISPLAYS

BACKGROUND

Field

Embodiments of the present disclosure generally relate to process chambers, such as plasma-enhanced chemical vapor deposition (PECVD) chambers. More particularly, embodiments of the present disclosure relate to a lid assembly for process chambers.

Description of the Related Art

In the manufacture of solar panels or flat panel displays, many processes are employed to deposit thin films on substrates, such as semiconductor substrates, solar panel substrates, and liquid crystal display (LCD) and/or organic light emitting diode (OLED) substrates, to form electronic devices thereon. The deposition is generally accomplished by introducing a precursor gas into a chamber having a substrate disposed on a temperature controlled substrate support. The precursor gas is typically directed through a gas distribution plate situated near the top of the chamber. The precursor gas in the chamber may be energized (e.g., excited) into a plasma by applying a radio frequency (RF) power to a conductive showerhead disposed in the chamber from one or more RF sources coupled to the chamber. The excited gas reacts to form a layer of material on a surface of the substrate that is positioned on the temperature controlled substrate support.

The size of the substrates for forming the electronic devices now routinely exceeds 1 square meter in surface area. Uniformity in film thickness across these substrates is difficult to achieve. Film thickness uniformity becomes even more difficult as the substrate sizes increase. Traditionally, plasma is formed in the conventional chambers for ionizing gas atoms and forming radicals of a deposition gas which are useful for deposition of a film layer on substrates of this size using a capacitively coupled electrode arrangement. Lately, interest in inductively coupled plasma arrangements, historically utilized in deposition on round substrates or wafers, is being explored for use in deposition processes for these large substrates. However, inductive coupling utilizes dielectric materials as structural supporting components. These dielectric materials do not have the structural strength to withstand structural loads created by the presence of atmospheric pressure against one side of a large area structural portion of the chamber on the atmospheric side thereof, and to vacuum pressure conditions on the other side thereof, as used in the conventional chambers for these larger substrates. Therefore, inductively coupled plasma systems have been undergoing development for large area substrate plasma processes. However, process uniformity, for example deposition thickness uniformity across the large substrate, is less than desirable.

Accordingly, what is needed in the art is a lid assembly of a chamber for use on large area substrates that is configured to improve film thickness uniformity across the deposition surface of a substrate.

SUMMARY

In one embodiment, a plate for a lid assembly is provided. The plate includes a plasma generation system and a gas distribution assembly. The plasma generation system has one or more cavities disposed in parallel in the plate. Each of the cavities includes recesses for a plurality of dielectric plates. Each of the dielectric plates have a bottom surface operable to be oriented with respect to a first pressure, and a top surface operable to be oriented opposite to the bottom surface and with respect to a second pressure different than the first pressure. One or more coils are positioned on or over the plurality of dielectric plates. The gas distribution assembly includes a first diffuser. The first diffuser includes one or more first diffuser inlets disposed in the plate and a plurality of first channels in fluid communication with at least one of the first diffuser inlets. Each first channel of the plurality of first channels is disposed in the plate and is adjacent to one of the recesses.

In another embodiment, a plate for a lid assembly is provided. The plate includes a plasma generation system and a gas distribution assembly. The plasma generation system has one or more cavities disposed in parallel in the plate. Each of the cavities includes recesses for a plurality of dielectric plates. One or more coils are positioned on or over the plurality of dielectric plates. The gas distribution assembly includes a first diffuser and a second diffuser. The first diffuser includes one or more first diffuser inlets disposed in the plate and in fluid communication with a plurality of first channels. The second diffuser includes one or more second diffuser inlets disposed in the plate and in fluid communication with a plurality of second channels. Each of the second channels is intersecting each of the first channels. Each of the dielectric plates is disposed adjacent to adjacent first channels and is disposed adjacent to at least one of the second channels.

In yet another embodiment, a chamber is provided. The chamber includes a chamber body, a substrate support disposed in the chamber body, and a lid assembly plate positioned opposite the substrate support. The lid assembly plate and the substrate support define a processing region in the chamber body. The lid assembly plate includes a plasma generation system and a gas distribution assembly. The plasma generation system has one or more cavities disposed in parallel in the lid assembly plate. Each of the cavities includes recesses for a plurality of dielectric plates. Each of the dielectric plates has a bottom surface positioned in the processing region and a top surface positioned outside the processing region. One or more coils are positioned on or over the plurality of dielectric plates. The gas distribution assembly includes a first diffuser. The first diffuser includes one or more first diffuser inlets disposed in the lid assembly plate and a plurality of first channels in fluid communication with at least one the first diffuser inlets. Each first channel of the plurality of first channels is disposed in the lid assembly plate and is adjacent to one of the recesses.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a lid assembly of a chamber for independent control of plasma density and gas distribution within the interior volume of the chamber. The lid assembly includes a plasma generation system and a gas distribution assembly. The plasma generation system includes a plurality of dielectric plates having a bottom surface oriented with respect to vacuum pressure and a top surface operable to be oriented with respect to atmospheric pressure. One or more coils are positioned on or over the plurality of dielectric plates. The gas distribution assembly includes a first diffuser and a second diffuser. The first diffuser includes a plurality of first channels intersecting a plurality of second channels of the second diffuser.

Figure 1:
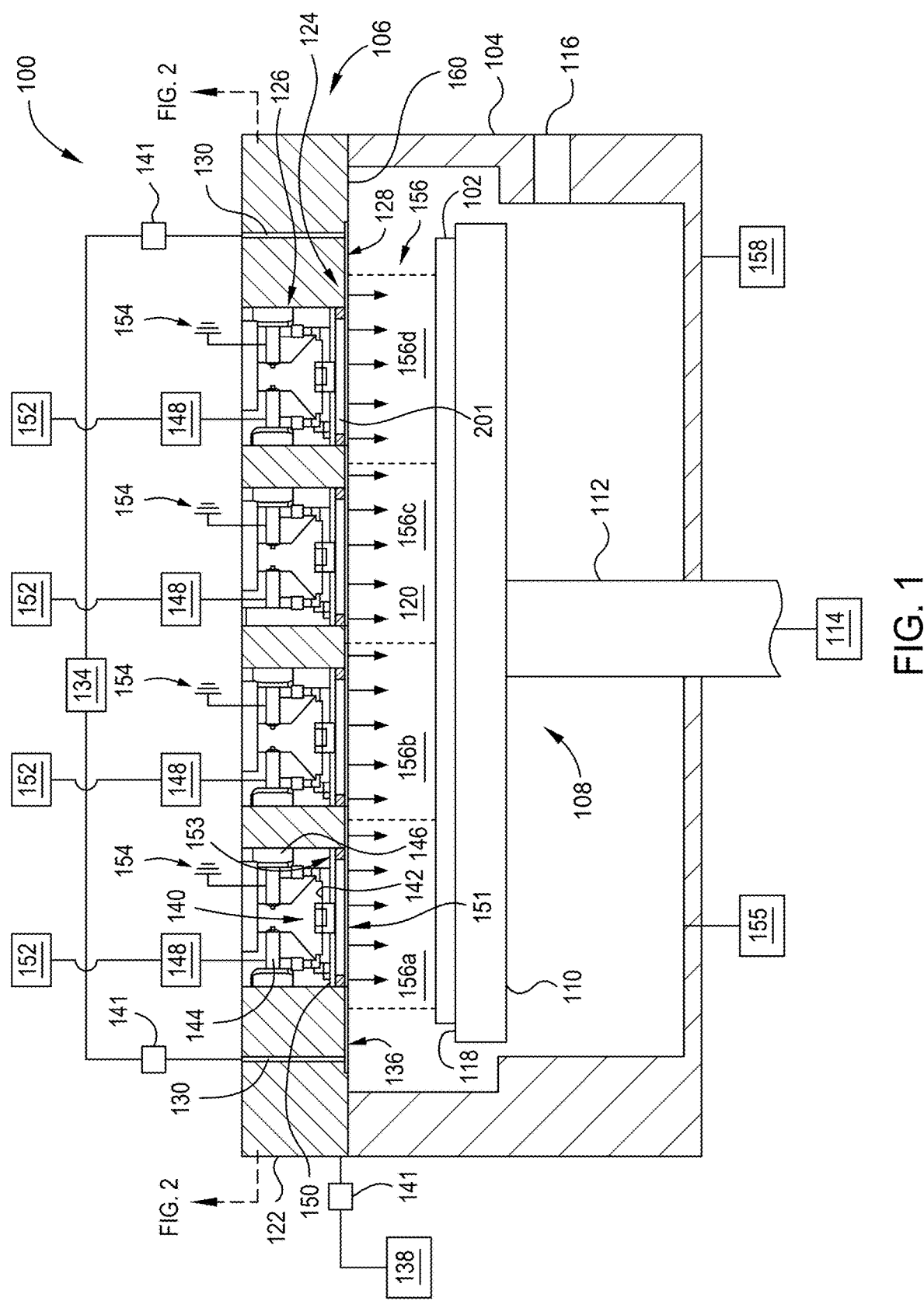
FIG. 1 is a schematic cross-sectional view of a chamber according to an embodiment.

FIG. 1 is a schematic cross-sectional view of a chamber 100, such as a PECVD chamber, that may benefit from embodiments described herein. Suitable chambers may be obtained from Applied Materials, Inc. located in Santa Clara, Calif. It is to be understood that the system described below is an exemplary chamber and other chambers, including chambers from other manufacturers, may be used with or modified to accomplish aspects of the present disclosure. The chamber 100 includes a chamber body, a lid assembly 106, and a substrate support assembly 108. The lid assembly 106 is disposed at an upper end of the chamber body 104.

The substrate support assembly 108 is at least partially disposed within the interior volume of the chamber body 104. The substrate support assembly 108 includes a substrate support 110 and a shaft 112. The substrate support 110 has a support surface 118 for supporting a substrate 102. In one embodiment, which can be combined with other embodiments described herein, the substrate 102 is a large area substrate, such as a substrate having a surface area of typically about 1 square meter or greater. However, the substrate 102 is not limited to any particular size or shape. In one aspect, the term "substrate" refers to any polygonal, squared, rectangular, curved or otherwise non-circular workpiece, such as a glass or polymer substrate used in the fabrication of flat panel displays, for example.

The substrate support 110 typically includes a heating element (not shown). The substrate support 110 is movably disposed within the interior volume of the chamber body 104 by the shaft 112 which extends through the chamber body 104 where the shaft 112 is connected to a substrate support drive system 114. The substrate support drive system 114 moves the substrate support 110 between an elevated processing position (as shown) and a lowered position that facilitates substrate transfer to and from the interior volume of the chamber body 104 through an opening 116 formed though the chamber body 104. In one embodiment, which can be combined with other embodiments described herein, the substrate support drive system 114 rotates the shaft 112 and the substrate support 110.

The lid assembly 106 includes a plate 122 that is disposed at an upper end of the chamber body 104. The plate 122 includes a gas distribution assembly 124 and a plasma generation system 126. The gas distribution assembly 124 includes one or more first diffuser inlets 130 of a first diffuser 128 disposed in the plate 122. In one embodiment, which can be combined with other embodiments described herein, the plate 122 includes aluminum-containing materials. In one embodiment, which can be combined with other embodiments described herein, the gas distribution assembly 124 includes one or more second diffuser inlets (shown in FIG. 3A and FIG. 3B) coupled to a second diffuser 136 disposed in the plate 122. The one or more first diffuser inlets 130 are coupleable to a first gas source 134. Each of the one or more first diffuser inlets 130 is in fluid communication with a first channel (shown in FIG. 3B) of the first diffuser 128. The one or more second diffuser inlets (shown in FIG. 3A and FIG. 3B) are coupleable to a second gas source 138. Each of the one or more second diffuser inlets (shown in FIG. 3A and FIG. 3B) is in fluid communication with a second channel (shown in FIG. 3B) of the second diffuser 136.

The first diffuser 128 delivers one or more first gases from the first gas source 134 to a processing region 120 between a bottom surface 160 of the plate 122 and the substrate support 110. The one or more first gases are provided to the processing region 120 through a plurality of first holes (shown in FIG. 4) of each first channel (shown in FIG. 3B) of the first diffuser 128. Flow controllers 141, such as a mass flow control (MFC) devices, are disposed between each of the one or more first diffuser inlets 130 and the first gas source 134 to control flow rates of first gases from the first gas source 134 to each first channel (shown in FIG. 3B), and thus provide independent control of first gas flows in the processing region 120. The one or more second gases are provided to the processing region 120 through a plurality of second holes (shown in FIG. 4) of each second channel (shown in FIG. 3B) of the second diffuser 136. Flow controllers 141 are disposed between each of the one or more second diffuser inlets (shown in FIG. 3A and FIG. 3B) and the second gas source 138 to control flow rates of second gases from the second gas source 138 to each second channel (shown in FIG. 3B), and thus provide independent control of second gas flows in the processing region 120. A pump 155 is in fluid communication with the processing region 120. The pump 155 is operable to control the pressure within the processing region 120 and to exhaust gases and byproducts from the processing region 120.

The plasma generation system 126 includes one or more cavities 140 disposed in parallel in the plate 122. Each of the one or more cavities 140 includes recesses (shown in FIGS. 2-4) for a plurality of dielectric plates 150. Each of the one or more cavities 140 includes one or more coils 142 positioned on or over the plurality of dielectric plates 150. The plurality of dielectric plates 150 provides a physical barrier having the structural strength to withstand structural loads created the presence of atmospheric pressure in the one or more cavities 140 and the presence of vacuum pressure within the interior volume of the chamber body 104. Each of the plurality of dielectric plates 150 includes a bottom surface 151 and a top surface 153 oriented opposite of the bottom surface 151. The bottom surface 151 is oriented with respect to (i.e., towards) the processing region 120 such that the bottom surface 151 of each of the dielectric plates 150 is exposed to a first pressure within the processing region 120, such as vacuum pressure. The top surface 153 is oriented opposite to (i.e., away from) the processing region 120 such that the top surface 153 of each of the dielectric plates 150 is exposed to a second pressure outside of the processing region 120, such as atmospheric pressure. In one embodiment, which can be combined with other embodiments described herein, the first pressure and second pressure are different.

In one embodiment, which can be combined with other embodiments described herein, the dielectric plates include at least one of aluminum oxide ($Al_2O_3$), aluminum nitride (AlN), quartz, zirconium dioxide ($ZrO_2$), zirconium nitride (ZrN), quartz, and glass materials. Each coil 142 has an electrical input terminal 144 connected to a power source 152 and an electrical output terminal 146 connected to a ground 154. In one embodiment, which can be combined with other embodiments described herein, each coil 142 is connected to the power source 152 through a match box 148 having a match circuit for adjusting electrical characteristics, such as impedance, of the coil 142. Each coil 142 is configured to create an electromagnetic field that energizes at least one of the one of more first gases and second gases into an inductively coupled plasma. The independent connection of each coil 142 of each of the one or more cavities 140 to the respective power source 152 allows for independent control of the power level and frequency provided to each coil 142. The independent control of the power level and frequency provided to each coil 142 allows for the density of the inductively coupled plasma to be independently controlled in the process zones 156a, 156b, 156c, 156d (collectively referred to as process zones 156) corresponding to each coil 142. A controller 158 is coupled to the chamber 100 and configured to control aspects of the chamber 100 during processing.

Figure 2:
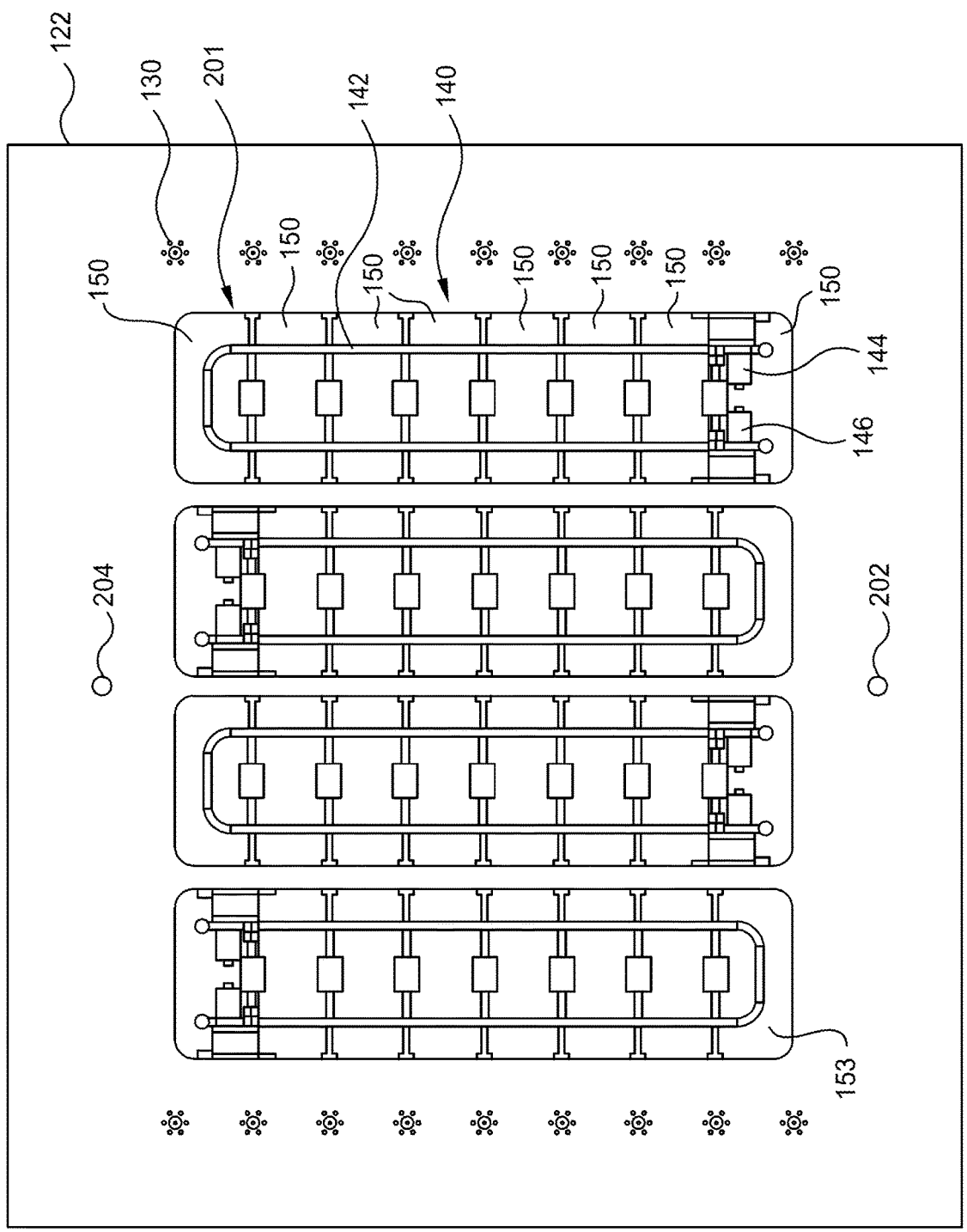
FIG. 2 is a schematic cross-sectional view of a plate according to an embodiment.

FIG. 2 is a schematic cross-sectional view of the plate 122. FIG. 2 shows the one or more first diffuser inlets 130 of the first diffuser 128 of the gas distribution assembly 124, and the one or more cavities 140, each coil 142, each electrical input terminal 144, each electrical output terminal 146, and the recesses 201 for the plurality of dielectric plates 150 of the plasma generation system 126. In one embodiment, which can be combined with other embodiments described herein, the lid assembly 106 includes a heat exchange system including a plurality of fluid channels (shown in FIG. 3B) coupleable to a heat exchanger (not shown). The heat exchanger, such as a chiller, is in fluid communication with each fluid channel via a fluid inlet 202 and a fluid outlet 204 of the plurality fluid channels (shown in FIG. 3B) such that the plate 122 is maintained at a predetermined temperature. Each coil 142 has one or more turns.

Figure 3A:
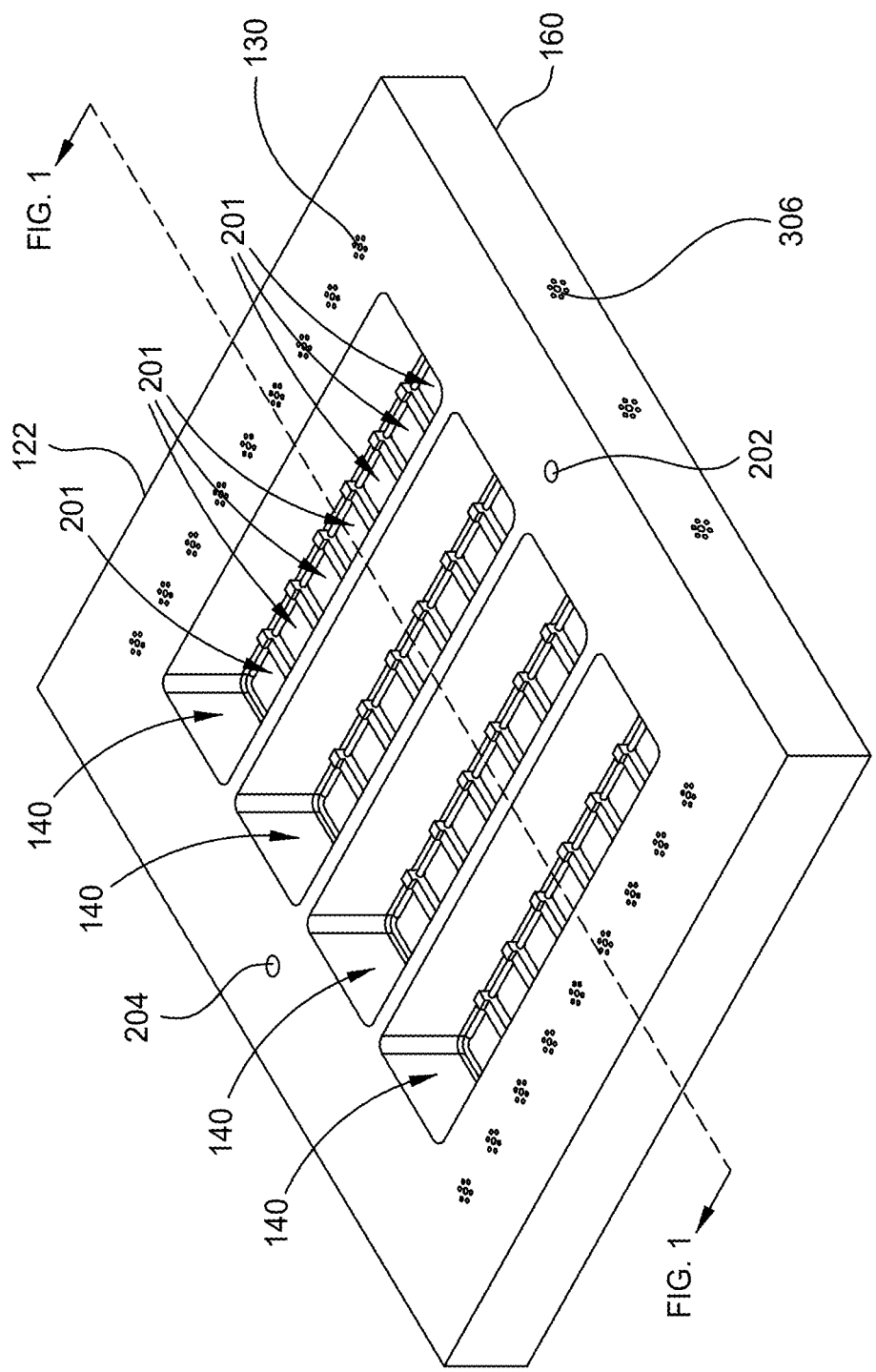
FIG. 3A is a schematic perspective view of a plate according to an embodiment.
Figure 3B:
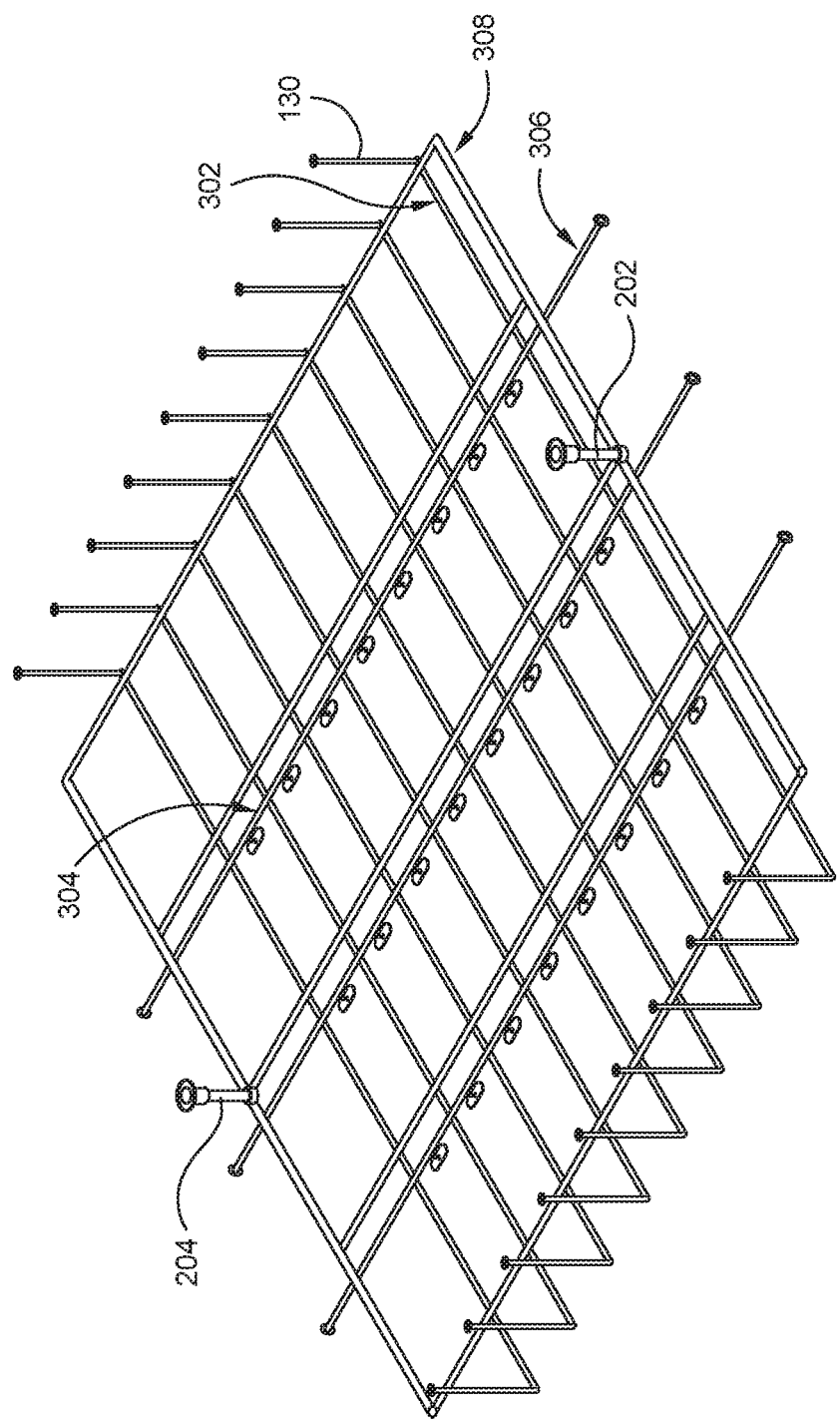
FIG. 3B is a negative perspective view of a plate according to an embodiment.

FIG. 3A is a schematic perspective view of the plate 122 without the plurality of dielectric plates 150 and each coil 142. FIG. 3B is a negative perspective view of the plate 122 without the plurality of dielectric plates 150 and each coil 142. The plate 122 includes a plurality of first channels 302. Each first channel of the plurality of first channels 302 is disposed adjacent to one of the recesses 201. Each of the recesses 201 is between two adjacent first channels 302 disposed in the plate 122. Each of the first channels 302 is in fluid communication with at least one first diffuser inlet of the one or more first diffuser inlets 130. In one embodiment, which can be combined with other embodiments described herein, the plate 122 includes a plurality of second channels 304 disposed in the plate 122. Each second channel of the plurality of second channels 304 is disposed between two adjacent cavities 140 of the one or more cavities 140. Each of the second channels 304 is in fluid communication with at least second diffuser inlet of the one or more second diffuser inlets 306 formed in the plate 122. In another embodiment, which can be combined with other embodiments described herein, the plate 122 includes a plurality of fluid channels 308 of the heat exchange system coupleable to a heat exchanger (not shown). The heat exchanger, such as a chiller, is in fluid communication with the plurality of fluid channels 308 via the fluid inlet 202 and the fluid outlet 204. The plurality of fluid channels 308 are disposed adjacent the one or more cavities 140 and exterior recesses of the recesses 201.

Figure 4:
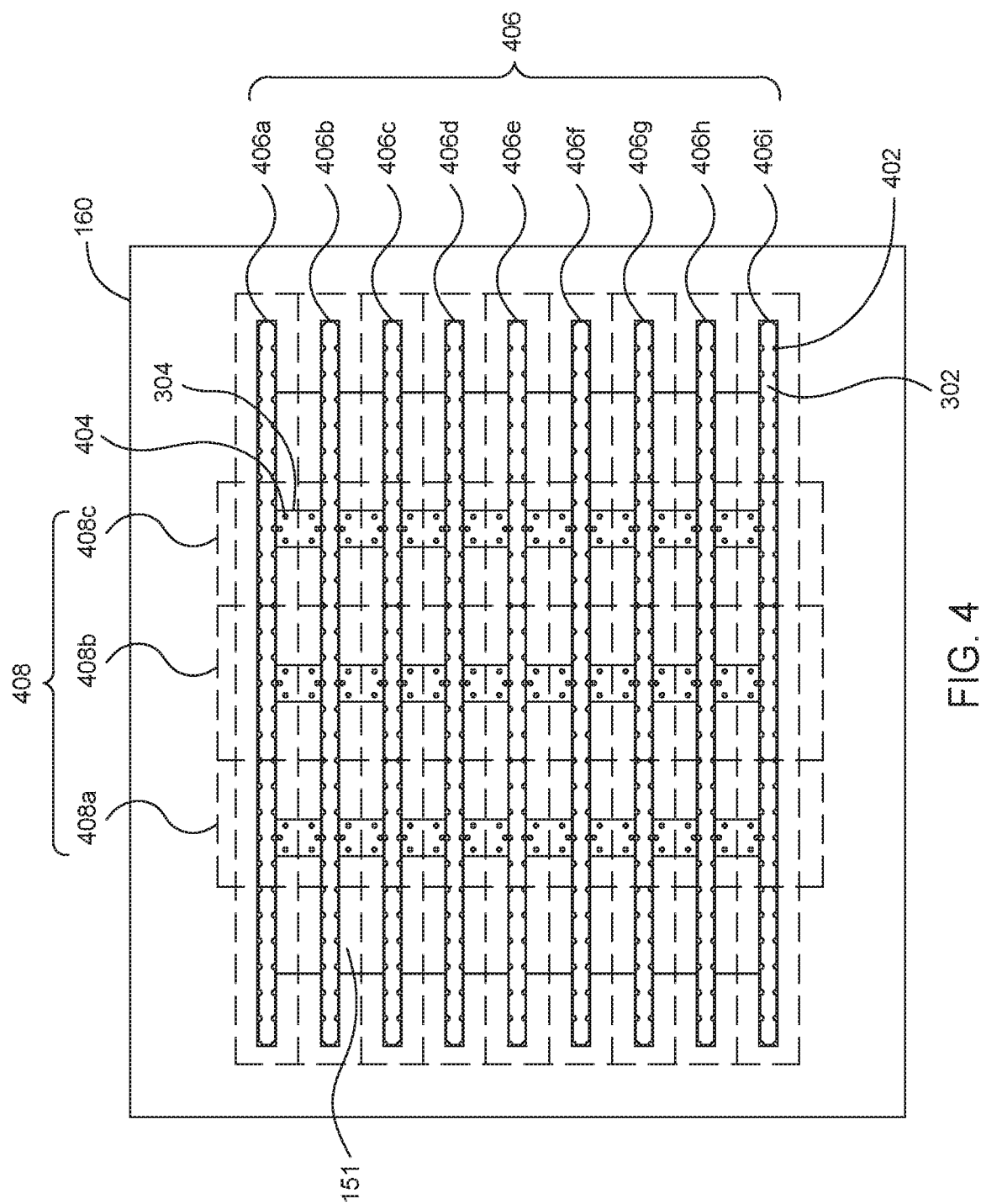
FIG. 4 is a schematic bottom view of a plate according to an embodiment.

FIG. 4 is a schematic bottom view of the plate 122. As shown in FIG. 4, each of the first channels 302 and each of the second channels 304 are intersecting. In one embodiment, which can be combined with other embodiments described herein, each of the first channels 302 are orthogonal to each of the second channels 304. Each of dielectric plates 150 is disposed adjacent to adjacent first channels 302 and is disposed adjacent to at least one of the second channels 304. Each first channel of the plurality of first channels 302 includes a plurality of first holes 402 extending through the plate 122. The flow controllers 141 control flow rates of first gases from the first gas source 134 through the plurality of first holes 402. The control of the flow rates of first gases provides independent control of the first gas flows in first zones 406a, 406b, 406c, 406d, 406e, 406f, 406g, 406h, 406i (collectively referred to as first zones 406) of the processing region 120 corresponding to each first channel of the plurality of first channels 302. In the embodiments with the second diffuser 136, which can be combined with other embodiments described herein, each second channel of the plurality of second channels 304 includes a plurality of second holes 404 extending through the plate 122. The flow controllers 141 control flow rates of second gases from the second gas source 138 through the plurality of second holes 404. The control of the flow rates of second gases provides independent control of the second gas flows in second zones 408a, 408b, 408c (collectively referred to as second zones 408) of the processing region 120 corresponding to each second channel of the plurality of second channels 304.

In summation, a lid assembly of a chamber for independent control of plasma density and gas distribution within the interior volume of the chamber is provided. The independent control of the power level and frequency provided to each coil allows for the density of the inductively coupled plasma to be independently controlled in the process zones corresponding to each coil. The control of the flow rates of first gases provides independent control of the first gas flows in first zones of the processing region corresponding to each first channel of the plurality of first channels. The control of the flow rates of second gases provides independent control of the second gas flows in second zones of the processing region corresponding to each second channel of the plurality of second channels.

Uniform gas flow across the processing region may be desirable in some embodiments. However, in other embodiments, the gas flow across the processing region may not be uniform. The non-uniform gas flow may be desirable due to some physical structure(s) and/or geometry of the chamber.

While the foregoing is directed to embodiments of the present disclosure, other and further embodiments of the disclosure may be devised without departing from the basic scope thereof, and the scope thereof is determined by the claims that follow.

What is claimed is:

1. A plate for a lid assembly, the plate comprising:
a plasma generation system, the plasma generation system comprising two or more cavities disposed in parallel in the plate, each cavity of the two or more cavities comprises:
a plurality of recesses, each recess of the plurality of recesses having a dielectric plate of a plurality of dielectric plates disposed thereon, each of the plurality of dielectric plates having:
a bottom surface operable to be oriented with respect to a first pressure; and
a top surface operable to be oriented opposite to the bottom surface and with respect to a second pressure different than the first pressure; and
one or more coils positioned on or over the plurality of dielectric plates in a respective cavity; and
a gas distribution assembly, the gas distribution assembly comprising:
a first diffuser, the first diffuser comprises:
one or more first diffuser inlets disposed in the plate; and
a plurality of first channels in fluid communication with at least one of the first diffuser inlets, each first channel of the plurality of first channels is disposed in the plate and is adjacent to at least one recess of the plurality of recesses; and
a second diffuser, the second diffuser comprises:
one or more second diffuser inlets disposed in the plate and in fluid communication with a plurality of second channels, each of the second channels is intersecting each of the first channels; and
each of the dielectric plates is disposed adjacent to adjacent first channels and is disposed adjacent to at least one of the second channels.

2. The plate of claim 1, wherein each coil of each cavity of the two or more cavities is configured to be connected to an independent power source.

3. The plate of claim 2, wherein each coil is configured to be connected to the independent power source through a match circuit.

4. The plate of claim 1, wherein each coil has one or more turns.

5. The plate of claim 1, wherein the plate comprises aluminum-containing materials.

6. The plate of claim 1, wherein the plurality of dielectric plates plates comprise at least one of aluminum oxide ($Al_2O_3$), aluminum nitride (ALN), quartz, zirconium dioxide ($ZrO_2$), zirconium nitride (ZrN), quartz, and glass materials.

7. The plate of claim 1, wherein
each second channel of the plurality of second channels is disposed in the plate between adjacent cavities.

8. The plate of claim 1, wherein the plate further comprises:
a fluid inlet and a fluid outlet disposed in the plate coupleable to a heat exchanger; and
a plurality of fluid channels in fluid communication with the fluid inlet and the fluid outlet, at least one of the plurality of fluid channels is disposed in the plate between adjacent cavities.

9. The plate of claim 1, wherein flow controllers are coupleable to each of the first diffuser inlets, and wherein the flow controllers are coupleable to each of the second diffuser inlets.

10. A plate for a lid assembly, the plate comprising:
a plasma generation system, the plasma generation system comprising two or more cavities disposed in parallel in the plate, each cavity of the two or more cavities comprises:
a plurality of recesses, each recess of the plurality of recesses having a dielectric plate of a plurality of dielectric plates disposed thereon; and
one or more coils positioned on or over the plurality of dielectric plates in a respective cavity; and
a gas distribution assembly, the gas distribution assembly comprising:
a first diffuser, the first diffuser comprises one or more first diffuser inlets disposed in the plate and in fluid communication with a plurality of first channels;
a second diffuser, the second diffuser comprises one or more second diffuser inlets disposed in the plate and in fluid communication with a plurality of second channels;
wherein:
each of the second channels is intersecting each of the first channels; and
each of the dielectric plates is disposed adjacent to adjacent first channels and is disposed adjacent to at least one of the second channels.

11. The plate of claim 10, wherein flow controllers are coupleable to each of the first diffuser inlets, and wherein the flow controllers are coupleable to each of the second diffuser inlets.

12. A chamber, comprising:
a chamber body;
a substrate support disposed in the chamber body; and
a lid assembly plate positioned opposite the substrate support, the lid assembly plate and the substrate support defining a processing region in the chamber body, the lid assembly plate comprises:
a plasma generation system, the plasma generation system comprising two or more cavities disposed in parallel in the lid assembly plate, each cavity of the two or more cavities comprises:
a plurality of recesses, each recess of the plurality of recesses having a dielectric plate of a plurality of dielectric plates disposed thereon, the plurality of dielectric plates having:
a bottom surface positioned in the processing region; and
a top surface positioned outside the processing region; and
one or more coils positioned on or over the plurality of dielectric plates in a respective cavity; and
a gas distribution assembly, the gas distribution assembly comprising a first diffuser, the first diffuser comprises:
one or more first diffuser inlets disposed in the lid assembly plate; and
a plurality of first channels in fluid communication with at least one of the first diffuser inlets, each first channel of the plurality of first channels is disposed in the lid assembly plate and is adjacent to at least one recess of the plurality of recesses; and
a second diffuser, the second diffuser comprises:
one or more second diffuser inlets disposed in the plate and in fluid communication with a plurality of second channels, each of the second channels is intersecting each of the first channels; and each of the dielectric plates is disposed adjacent to adjacent first channels and is disposed adjacent to at least one of the second channels.

13. The chamber of claim 12, wherein each coil of each cavity of the two or more cavities is configured to be connected to an independent power source.

14. The chamber of claim 13, wherein each coil is configured to be connected to the independent power source through a match circuit.

15. The chamber of claim 12, wherein each coil has one or more turns.

16. The chamber of claim 12, wherein the lid assembly plate comprises aluminum-containing materials.

17. The chamber of claim 12, wherein the plurality of dielectric plates comprise at least one of aluminum oxide ($Al_2O_3$), aluminum nitride (ALN), quartz, zirconium dioxide ($ZrO_2$), zirconium nitride (ZrN), quartz, and glass materials.

18. The chamber of claim 12, wherein the gas distribution assembly further comprises a second diffuser comprising:
  one or more second diffuser inlets disposed in the lid assembly plate; and
  a plurality of second channels in fluid communication with at least one of the second diffuser inlets, each second channel of the plurality of second channels is disposed in the lid assembly plate between adjacent cavities.

* * * * *